US005498890A

United States Patent [19]

Kim et al.

[11] Patent Number: 5,498,890
[45] Date of Patent: Mar. 12, 1996

[54] SEMICONDUCTOR DEVICE HAVING A MULTI-LAYERED DIELECTRIC STRUCTURE AND MANUFACTURING METHOD THEREOF

[75] Inventors: Sungtae Kim, Seoul; Soohan Choi, Kyungi-do, both of Rep. of Korea

[73] Assignee: Samsung Electronics Co., Ltd., Rep. of Korea

[21] Appl. No.: 908,998

[22] Filed: Jul. 6, 1992

Related U.S. Application Data

[62] Division of Ser. No. 799,909, Nov. 26, 1991, abandoned, which is a continuation of Ser. No. 485,961, Feb. 27, 1990, abandoned.

[30] Foreign Application Priority Data

Nov. 8, 1989 [KR] Rep. of Korea ...................... 89-16179

[51] Int. Cl.⁶ .................... H01L 27/108; H01L 29/792; H01L 29/76; H01L 29/94
[52] U.S. Cl. .......................... 257/310; 257/296; 257/298; 257/324; 361/306.3; 361/312; 361/313
[58] Field of Search ..................... 257/298, 310, 257/296, 301, 303, 306, 324, 325, 326; 361/306.3, 312, 313

[56] References Cited

U.S. PATENT DOCUMENTS 5,051,794   9/1991   Mori ......................................... 257/324

FOREIGN PATENT DOCUMENTS 61-145854   7/1986   Japan ..................................... 257/310

*Primary Examiner*—Steven H. Loke
*Attorney, Agent, or Firm*—Evenson, McKeown, Edwards & Lenahan

[57] ABSTRACT

A semiconductor device and a manufacturing method thereof are disclpsed, the semiconductor device comprising: a first conductive layer; an oxide layer formed upon the first conductive layer; a nitride layer composed of multiple sublayers formed upon the oxide layer; another oxide layer formed upon the nitride layer in the form of multiple sublayers; and a second conductive layer formed upon the structure obtained through the preceding steps. Due to the unique feature of the nitride layer composed of multiple sublayers, the electrical characteristics of the semiconductor device according to the present invention is improved, and the nitride layer according to the present invention is widely applicable to semiconductor devices.

3 Claims, 2 Drawing Sheets

SEMICONDUCTOR DEVICE HAVING A MULTI-LAYERED DIELECTRIC STRUCTURE AND MANUFACTURING METHOD THEREOF

This application is a divisional of U.S. application Ser. No. 07/799,909, filed Nov. 26, 1991, now abandoned, which is a continuation of U.S. application Ser. No. 07/485,961, filed Feb. 27, 1990, which is also abandoned.

BACKGROUND OF THE INVENTION

The present invention relates to a semiconductor device and a manufacturing method thereof, and particularly to a semiconductor device and a manufacturing method thereof, in which the characteristics of the dielectric layer used in the formation of the capacitor of the memory device can be improved.

With the recent progress of the semiconductor manufacturing techniques and the expansion of its application field, the developments of large capacity memory devices are promoted. Particularly, an outstanding advancement has been achieved in improving the density of DRAM (Dynamic Random Access Memory) by developing a memory cell consisting of a single capacitor and a single transistor.

According to the memory cell structure for increasing the density of DRAM, the conventional planar type capacitor cell is evolved to a stacked type capacitor and a trenched type capacitor, and the trenched-type capacitor has been put to practical use in 1 M bit DRAM.

As the material of the dielectric layer for the capacitor of such a high density memory cell, the conventional oxide layer has been replaced with a nitride/oxide layer structure, and an oxide/nitride/oxide layer (ONO layer) which is a stacked-type, this being under diversified research. The process for manufacturing the ONO layer is illustrated in FIGS. 1A to 1D, and this will be described in brief terms below.

Firstly, an oxide layer OX1 is formed in a thickness of 10Å–200Å upon a capacitor substrate; a nitride layer N is formed in a thickness of 50Å–200Å upon the oxide layer OX1 as shown in FIG. 1B by applying a low chemical vapor deposition (to be called hereinafter "LPCVD") device; and the nitride layer N is subjected to an oxidation in a thickness of 10Å–200Å as shown in FIG. 1C to form a second oxide layer OX2, thereby forming a dielectric layer I fo the oxide/nitride/oxide structure.

Upon the above-described second oxide layer OX2, a polycrystalline silicon is formed in a thickness of 500Å–3000Å to form an upper substrate 11, thereby completing a capacitor as shown in FIG. 1D.

According to such a conventional dielectric layer manufacturing method, the nitride layer has a dielectric constant E larger by 1.9 times then the simple oxide layer, but it has disadvantages such as the crystallizing defects and pin holes produced in the layer itself and the biased impurity diffusions due to the spreading characteristics of the LPCVD device which is used in the formation of the layer. Accordingly, the leakage current is increased even under the supply voltage, thereby degrading the electrical characteristics of the capacitor.

SUMMARY OF THE INVENTION

Therefore, it is an object of the present invention to provide a dielectric layer having a multilayer structure by which the above-described conventional disadvantages can be overcome.

It is another object of the present invention to provide a manufacturing method for the dielectric layer, which is efficient in manufacturing the dielectric layer.

In achieving the above objects, the dielectric layer according to the present invention comprises: an oxide layer formed upon a first conductive layer; a nitride layer composed of multiple nitride sublayers, i.e., a "multi-sublayered nitride layer", and formed upon the oxide layer; and a second oxide layer formed upon the nitride layer composed of the multiple nitride sublayers, all the above layers forming a structure of an oxide layer/multi-sublayered nitride layer/oxide layer.

The manufacturing method which is suitable for manufacturing the dielectric layer according to the present invention is characterized in that in case of forming the multi-sublayered nitride layer upon the oxide layer which is formed upon the first conductive layer, ultra-thin oxide sublayers are formed between the multiple nitride sublayers in a natural or artificial manner in order to complement the defects of the nitride layer.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE INVENTION

Figure 1A:
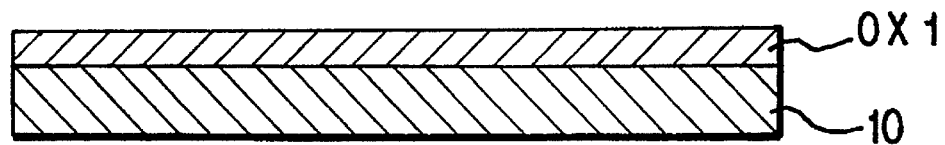
FIGS. 1A to 1D illustrate the process for manufacturing the conventional dielectric layer.
Figure 1B:
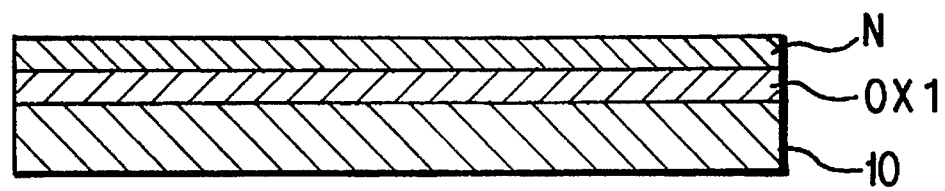
Figure 1C:
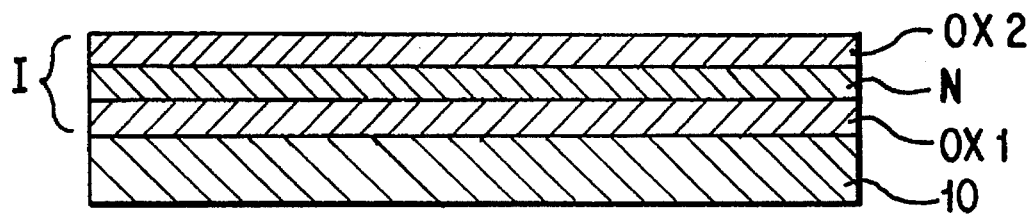
Figure 1D:
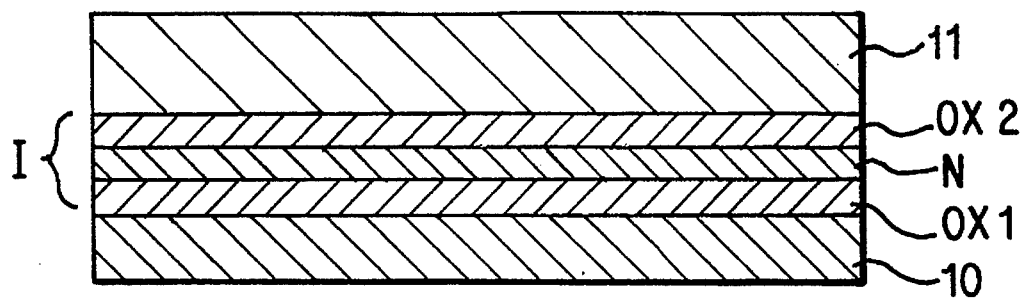
Figure 2A:
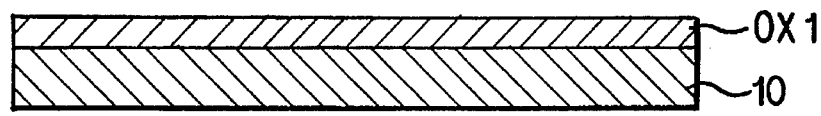
FIGS. 2A to 2D illustrate the process for manufacturing a dielectric layer according to the present invention.
Figure 2B:
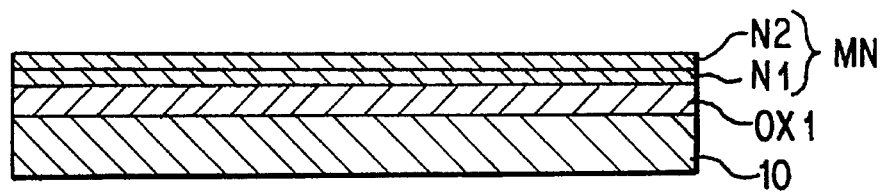
Figure 2C:
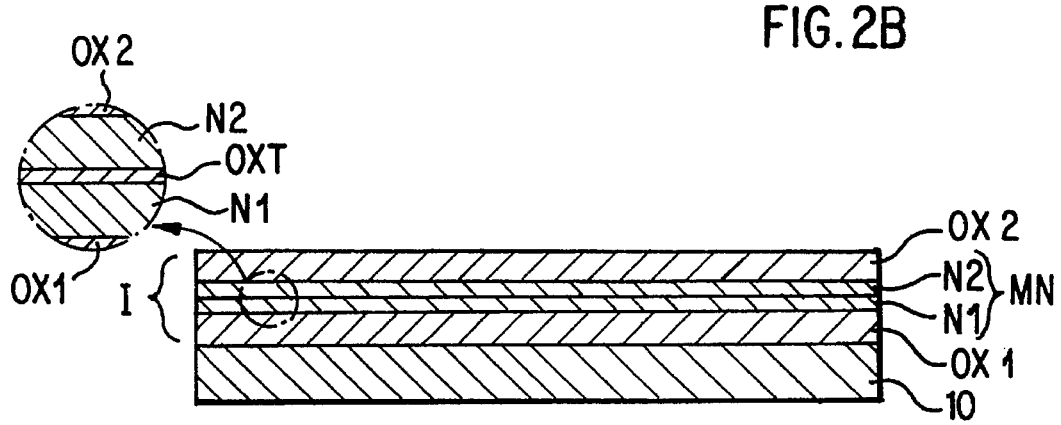
Figure 2D:
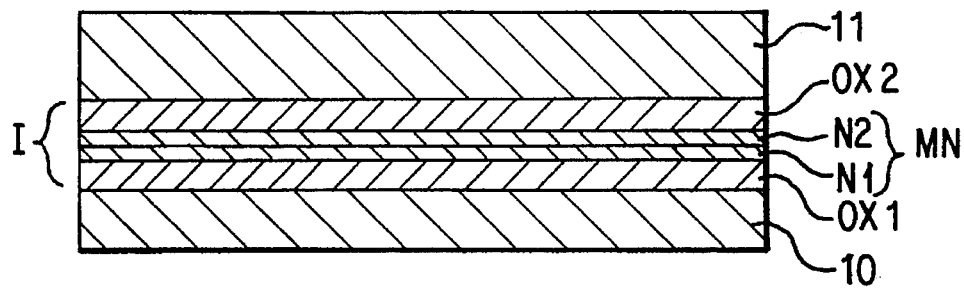

As shown in FIG. 2C, the dielectric layer I according to the present invention is formed in such a manner that an oxide layer OX1 is formed upon a first conductive layer 10, a first nitride sublayer N1, a second nitride sublayer N2 and so on are formed on the oxide layer OX1 to form a multi-sublayered nitride layer MN, and a second oxide layer OX2 is formed on the multi-sublayered nitride layer MN, thereby completing a structure of oxide layer OX1/multi-sublayered nitride layer MN/oxide layer OX2.

The process for manufacturing the dielectric layer according to the present invention comprises four different steps, and each of the steps will be described separately referring to FIGS. 2A to 2D.

The first step is the one for forming the oxide layer OX1 upon the first conductive layer 10, and in which the oxide layer OX1 is formed in a thickness of 10Å–200Å upon a polycrystalline or monocrystalline silicon layer which is the first conductive layer as shown in FIG. 2A.

The second step is the one in which the multi-sublayered nitride layer MN is formed upon the structure obtained through the first step, and to describe it more specifically, a nitride layer MN is formed in a thickness of 50Å to 200Å upon the oxide layer OX1 of the first step by supplying NH3 gas through the use of an LPCVD device, in such a manner that the nitride layer MN should consist of multiple nitride sublayers formed through repeating the above step as shown in FIG. 2B.

Furthermore, this multi-sublayered nitride layer MN is formed in such a manner that, in order to complement the defects of the nitride sublayer itself, ultra-thin oxide layer OXT (see insert of FIG. 2C) are formed in a thickness of less than 10Å between the multiple nitride sublayers within the limited time in a natural or artificial manner. That is, by applying an LPCVD device, a first nitride sublayer N1 is formed upon the oxide layer OX1 which is formed upon the first conductive layer 10, the surface of the first nitride sublayer N1 is aged at the room temperature to form an ultra-thin oxide layer OXT having a thickness of less than 10Å, and a second nitride sublayer N2 is formed by applying an LPCVD device, again such a cycle being repeated at least once or more.

The third step is the one for forming the second oxide layer OX2 upon the structure obtained through the second step, and in which the second oxide layer OX2 is formed in a thickness of 15Å–200Å upon the multi-sublayered nitride layer MN obtained through the preceding step as shown in FIG. 2C, thereby obtaining the dielectric layer having the structure of oxide layer/multi-sublayered nitride layer/oxide layer.

The fourth step is the final step in which a polycrystalline silicon layer as a second conductive layer 11 is formed in a thickness of 500Å–3000Å upon the dielectric layer I obtained through the preceding steps, thereby completing a capacitor of a large capacity memory device.

In the dielectric layer manufactured according to the manufacturing process of the present invention, the nitride layer as one of the components is formed in multiple sublayers, and, when the multiple sublayers are formed, ultra-thin oxide layers are formed between the multiple sublayers by aging each of the sub layers within the limited time. This can eliminate the defects which are seen when the nitride layer is formed through a single process, i.e., those defects such as a biased diffusion of the impurity and pin holes formed in the layer itself due to the spreading characteristics of the LPCVD device, thereby improving the characteristics of the dielectric layer.

Therefore, if such a dielectric layer including the multiple sublayered nitride layer is used in the capacitor of memory cells, the electrical characteristics of the capacitor is improved in comparison with the conventional capacitor. Furthermore, the leakage current is also reduced to a value which is smaller by 1 order in comparison with that of the conventional dielectric layer, and in case where a voltage breakdown is assumed to occur at a leakage current of 1 A, the dielectric layer of the present invention has an advantage of 10%.

The manufacturing process of the present invention can be applied not only to the planar type, stacked type and trenched type capacitors of memory devices, but also to an interpoly between a floating gate and an adjusting gate of an EEPROM (Electrically Erasable and Programmable Read Only Memory) which is capable of electrically erasing and writing. Furthermore, the multi-sublayered nitride layer can also be applied to other semiconductor devices using nitride layers.

What is claimed is:

1. A semiconductor device comprising a first electrical conductive layer formed on a semiconductor substrate; a first silicon oxide layer formed on said first electrical conductive layer; at least two silicon nitride sublayers formed on said first silicon oxide layer; a second silicon oxide layer formed on said silicon nitride sublayers; and a second electrical conductive layer formed on said second silicon oxide layer, wherein an ultra-thin silicon oxide layer is disposed between said silicon nitride sublayers.

2. The semiconductor device as claimed in claim 1, wherein said ultra-thin silicon oxide layer has a thickness of less than 10Å.

3. The semiconductor device as claimed in claim 1, wherein said at least two silicon nitride sublayers have a combined thickness of 50Å–200Å.

\* \* \* \* \*